US008222920B2

(12) United States Patent
Barbier

(10) Patent No.: US 8,222,920 B2
(45) Date of Patent: Jul. 17, 2012

(54) DYNAMIC PHASE ALIGNMENT

(75) Inventor: Jean Barbier, Montpellier (FR)

(73) Assignee: Meta Systems, Meudon la Foret (FR)

( * ) Notice: Subject to any disclaimer, the term of this patent is extended or adjusted under 35 U.S.C. 154(b) by 397 days.

(21) Appl. No.: 12/642,658

(22) Filed: Dec. 18, 2009

(65) Prior Publication Data

US 2011/0148459 A1 Jun. 23, 2011

(51) Int. Cl.
*H03K 17/00* (2006.01)
*H03K 19/173* (2006.01)
*G11C 27/02* (2006.01)

(52) U.S. Cl. ............... 326/38; 326/93; 327/94; 327/158

(58) Field of Classification Search .................... 326/38, 326/40, 46, 93; 327/94, 95, 158
See application file for complete search history.

(56) References Cited

U.S. PATENT DOCUMENTS

| | | | | |
|---|---|---|---|---|
| 6,292,116 | B1 | 9/2001 | Wang et al. | |
| 6,650,140 | B2 | 11/2003 | Lee et al. | |
| 6,690,201 | B1 | 2/2004 | Simkins et al. | |
| 6,944,577 | B1 | 9/2005 | Mauer et al. | |
| 7,138,837 | B2 | 11/2006 | Venkata et al. | |
| 7,453,968 | B2 | 11/2008 | Chang et al. | |
| 2009/0027093 | A1 * | 1/2009 | Chen et al. | 327/158 |

* cited by examiner

*Primary Examiner* — Daniel D Chang
(74) *Attorney, Agent, or Firm* — Dickstein Shapiro LLP

(57) ABSTRACT

Embodiments of the present disclosure provide methods and integrate circuits with dynamic phase alignment between an input data signal and a clock signal. In some embodiments, a sampling window of the input data signal may be determined and timing of the input data signal may be adjusted to enable the input data signal to be sampled within the sampling window. Other embodiments may be disclosed and claimed.

16 Claims, 5 Drawing Sheets

DYNAMIC PHASE ALIGNMENT

FIELD

Embodiments of the present disclosure relate to the field of integrated circuits, and more particularly, to integrated circuits with dynamic phase alignment between an input data signal and a system clock signal.

BACKGROUND

Errors may occur when an input data signal is sampled during the setup time or hold time of the input data signal. This problem may be even more prevalent when the timing of an input data signal, and/or the sample timing of the input data signal, varies over time. Various methods have been created to avoid such errors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means "(A), (B), or (A and B)." For the purposes of the present disclosure, the phrase "A, B, and/or C" means "(A), (B), (C), (A and B), (A and C), (B and C), or (A, B and C)."

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
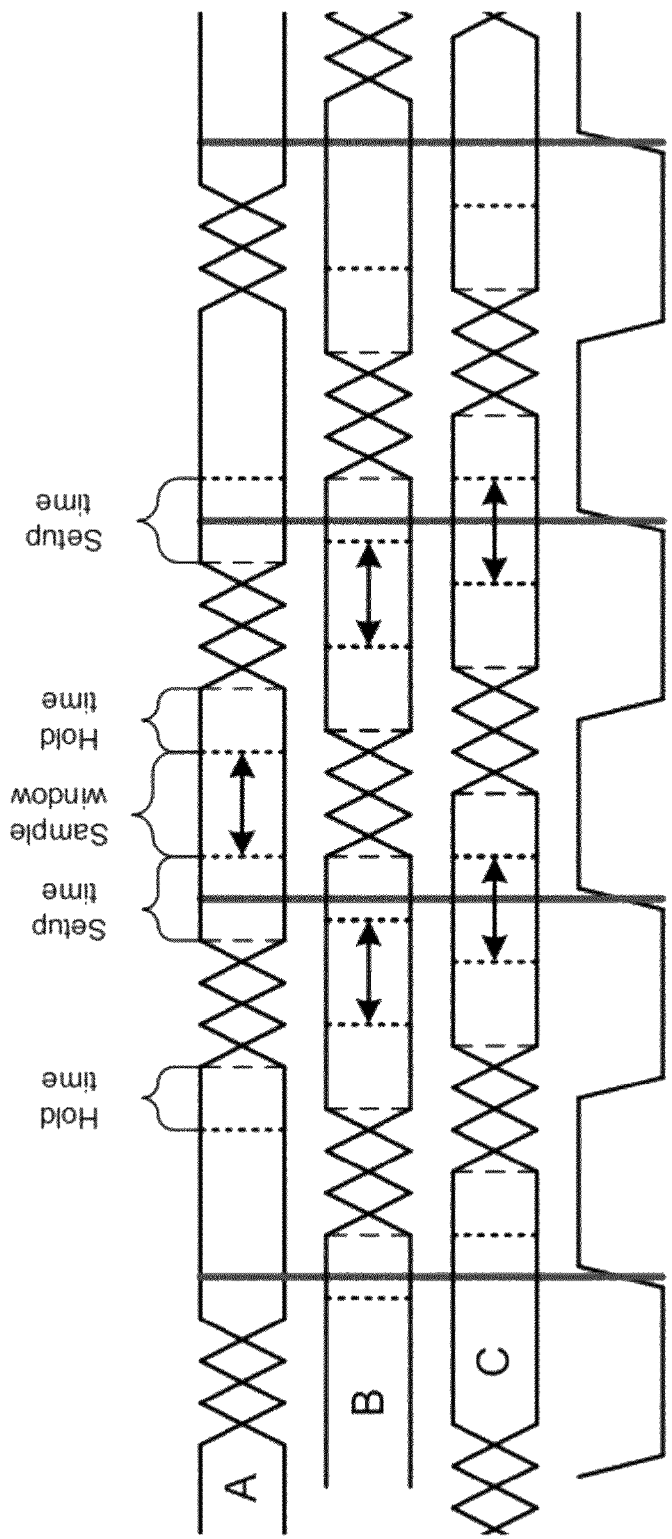
FIG. 1 illustrates example scenarios of sampling three input data signals according to a common clock signal.

FIG. 1 shows three input signals sampled using a common clock signal. A sampling window may be a period of time during which the input data signal is stable enough to be sampled. A setup time and a hold time may be determined by the requirements of a sampling device (e.g., a register) and may be relative to the clock signal. For example, a sampling device may require that a signal be stable for a certain period of time (i.e., the setup time) before the sampling device can sample the signal. The sampling device may also require that the signal be stable for a certain period of time (i.e., the hold time) after the sampling device has sampled the signal. A sampling window of an input data signal may therefore be defined relative to the setup time and the hold time, extending from the end of the setup time, after a change of the input signal, until the beginning of the hold time, prior to the next change of the input signal. Sampling an input signal outside of a sampling window may result in errors. In various embodiments, sampling of an input data signal may be accomplished by using a flip-flop or latch, and may be triggered by a rising or falling edge of the clock signal.

In FIG. 1, the four vertical lines extending through the three input data signals A, B, and C represent time points where signals A, B and C are sampled. In various scenarios, these time points may correspond to rising or falling edges of the clock signal. As illustrated in FIG. 1, input data signal A may be delayed too much, such that signal A may be sampled during the setup time of signal A. On the other hand, the amount of delay of input data signal B may not be enough, such that signal B may be sampled during the hold time. For the example scenarios, only input data signal C may be sampled within the sampling window. This is in part because the amount of delay of input data signal C may be well adjusted, such that signal C may be sampled at the center of the sampling window. Sampling during the sampling window may allow reliable operation in the presence of variations in circuit timing such as delay variations and clock jitter.

Figure 2:
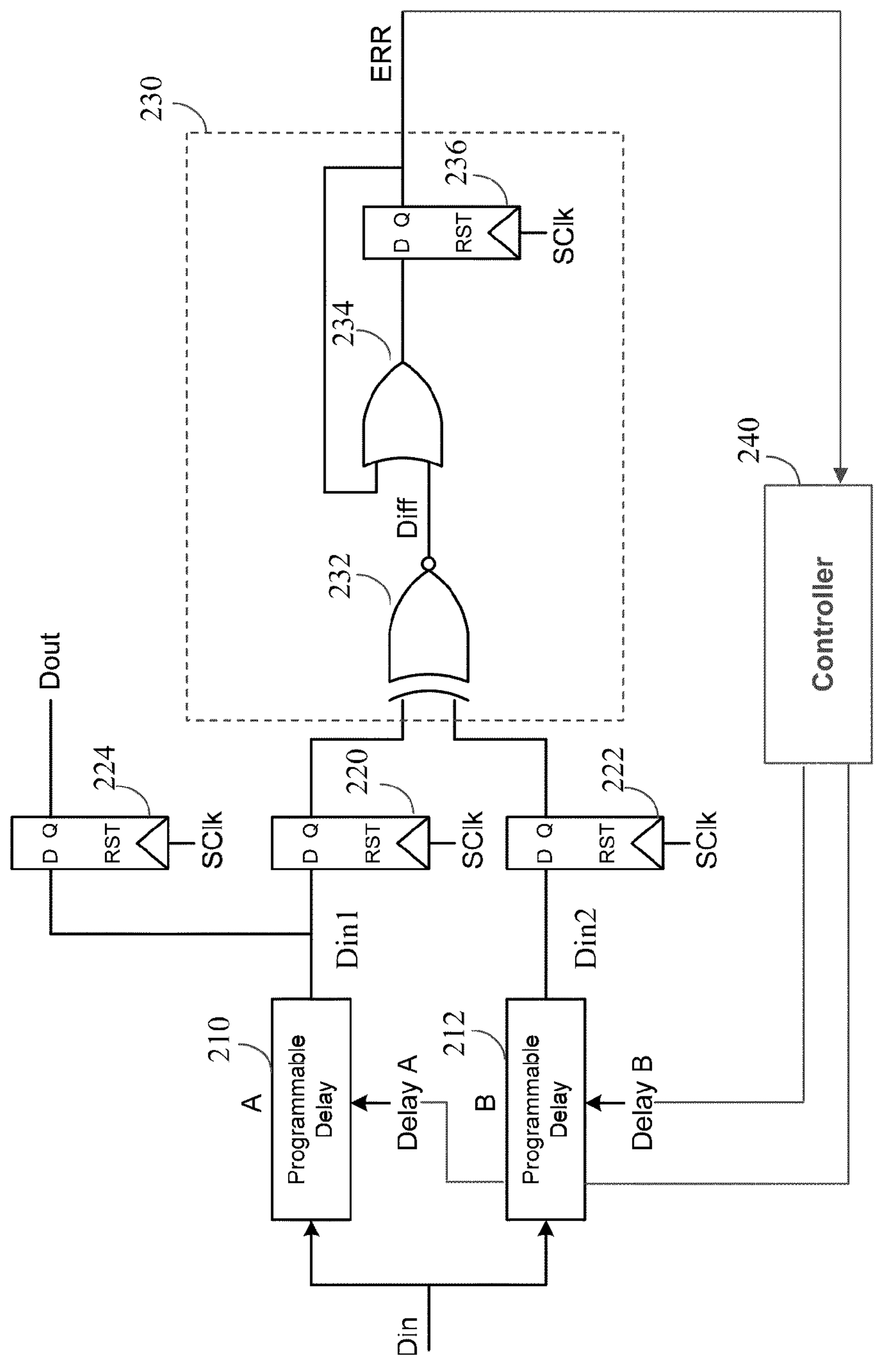
FIG. 2 illustrates an integrated circuit with dynamic phase alignment in accordance with various embodiments of the present disclosure.

FIG. 2 illustrates a circuit 200 that may dynamically adjust phase alignment between an input data signal and a system clock signal by tuning the amount of delay applied to the input data signal in accordance with various embodiments of the present disclosure. In various embodiments, circuit 200 may include two programmable delay units 210 and 212, two sampling units 220 and 222, a comparator 230, and a controller 240 coupled with delay units 210, 212 and comparator 230 as shown.

In various embodiments, a data signal Din may be input to circuit 200 and provided to both delay units 210 and 212. In various embodiments, delay unit 210 may be configured to apply a first amount of delay Delay A to Din and generate a delayed data signal Din1. Similarly, delay unit 212 may be configured to apply a second amount of delay Delay B and generate a probe signal Din2. In various embodiments, probe signal Din2 may be used as a reference to Din1 in order to adjust Delay A as described below.

In various embodiments, Din1 and Din2 may be sampled by two sampling units 220 and 222 respectively. In various embodiments, sampling units 220 and 222 may be D flip-flops. Sampling units 220 and 222 may be configured to operate under the control of a system clock signal SClk. In various embodiments, Din1 and Din2 may be sampled at one or more rising or falling edge(s) of SClk.

In various embodiments, one or more sampled values of Din1 and Din2 may be sent to comparator 230. Comparator 230 may be configured to generate a value ERR by comparing the sampled values of Din1 and Din2. In various embodiments, the value ERR may represent the relationship, for example the difference, between the one or more sampled values of Din1 and Din2. In various embodiments, when the sampled values of Din1 and Din2 are the same, ERR may equal to 0 whereas when the sampled values of Din1 and Din2 are different, ERR may equal to 1.

In various embodiments, one or more values of ERR may be provided to controller 240. Controller 240 may be configured to determine values of Delay A and B based at least on the one or more values of ERR and send determined values of Delay A and B to delay units 210 and 212. In various embodiments, controller 240 may send initial values of Delay A and B to delay units 210 and 212 before delay units 210 and 212 start operating. In other embodiments, delay units 210 and 212 may continue to use the values of Delay A and B from a previous cycle if no updates are received from controller 240.

In other embodiments, circuit 200 may further include another sampling unit 224 coupled to the output of delay unit 210, and configured to output Din1 as the output of circuit 200. In various embodiments, sampling unit 224 may also operate according to SClk.

In other embodiments, comparator 230 may specifically include an XNOR gate 232 configured to receive the sampled values of Din1 and Din2, and generate a difference value Diff. In various embodiments, Diff and the current value of ERR may be provided to an OR gate 234 which may output to another sampling unit 236. In various embodiments, sampling unit 236 may be configured to output the updated value of ERR. In various embodiments, sampling unit 236 may be configured to operate according to SClk as well.

Figure 3:
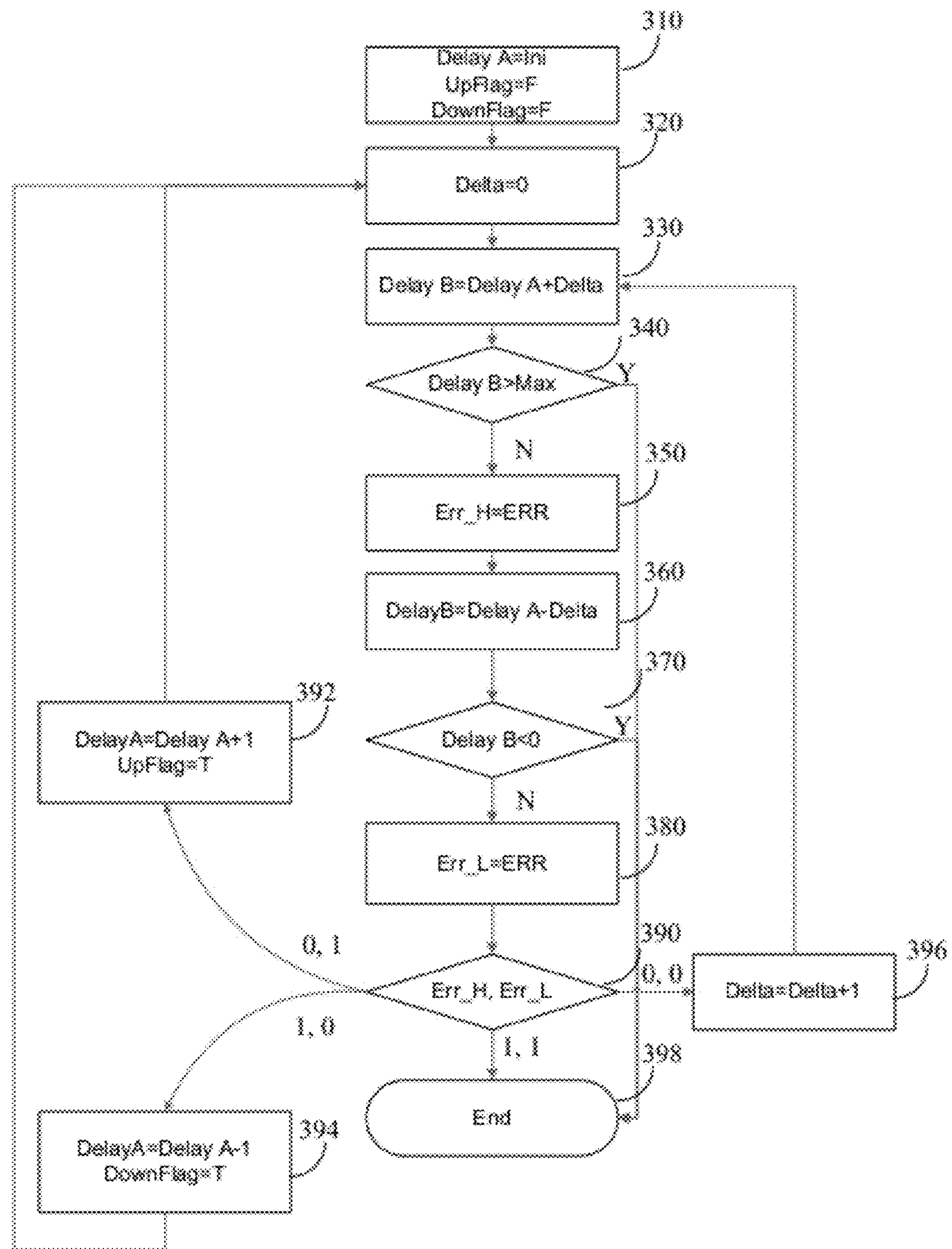
FIG. 3 illustrates a method for a controller to adjust the dynamic phase alignment in accordance with various embodiments of the present disclosure.

FIG. 3 is a flowchart depicting a method for controller 240 to control delay units 210 and 212 in order to obtain a dynamic phase alignment between Din1 and SClk in accordance with various embodiments. At block 310, controller 240 may provide an initial value of Delay A to delay unit 210. In other embodiments, at block 310, controller 240 may also set an UpFlag and DownFlag of Delay A to be "False" indicating that the value of Delay A has not been incremented or decremented.

At block 320, a variable Delta may be initialized to be 0, where Delta may be used to represent the amount of difference between Delay A and Delay B. At block 430, Delay B may be calculated by adding the value of Delta to Delay A. At block 340, controller 240 may determine whether Delay B exceeds a maximum delay value or not. In various embodiments, the maximum delay value may be pre-determined and stored in controller 240. In various embodiments, Delay B may be determined at block 340 to have exceeded the maximum value. In that case, controller 240 may direct the process to an end at block 398.

At block 350, controller 240 may send the values of Delay A and B to delay units 210 and 212 and then receive a value of ERR from comparator 230. This ERR value may indicate the relationship between the sampled values of Din1 and Din2, and controller 240 may store this ERR value as ERR_H at block 350.

At block 360, Delay B may be calculated as Delay A minus Delta. At block 370, controller 240 may determine whether Delay B is lower than 0 or not. In one embodiment, Delay B is lower than 0, controller 240 may terminate the process at block 398.

At block 380, controller 240 may send the values of Delay A and B calculated at block 360 to delay units 210 and 212 and then receive another value of ERR from comparator 230. This ERR value may indicate the relationship between the sampled values of Din1 and Din2, and controller 240 may store this ERR value as ERR_L at block 380.

In various embodiments, the value of Delta used at block 360 may be the same as the value of Delta used at block 330 in order to sample Din1 at the center of the sampling window. In another embodiment, the value of Delta used at blocks 330 and 360 may be different in order to sample Din1 at a certain position within the sampling window. In various embodiments, the widths of sampling windows of the input data signal Din are the same.

At block 390, controller 240 may direct the process to different blocks based, at least in part, on the different combinations of ERR_H and ERR_L. In various embodiments, ERR_H and ERR_L may both be 0 which means that the sampled values of Din1 and Din2 are the same regardless of whether Delay B is greater or smaller than Delay A. In various embodiments, ERR_H and ERR_L both equal to 0 may indicate that neither of the two ends of a sampling window of Din1 is reached yet.

In various embodiments, controller 240 may further direct the process to block 396. At block 396, Delta may be incremented and the process may be directed back to block 330 to further explore the two ends of a sampling window of Din1. In various embodiments, Delta may be incremented by a value of 1 or a value higher than 1 at block 396.

In other embodiments, ERR_H and ERR_L may both have the value of 1, which may mean that the sampled values of Din1 and Din2 are different regardless of whether Delay B is greater or smaller than Delay A. In various embodiments, ERR_H and ERR_L may both be equal to the value of 1, which may indicate that the two ends of a sampling window of Din1 have been reached and that, Din1 is sampled within or at about the center of the sampling window. At such point, controller 240 may direct the process to an end at block 398.

In other embodiments, ERR_H may have the value 0, and ERR_L may have the value 1, which may mean that the sampled values of Din1 and Din2 are the same when Delay B is greater than Delay A, whereas the sampled value of Din2 is different from the sampled value of Din1 when Delay B is smaller than Delay A. In various embodiments, ERR_H may be equal to the value 0 and ERR_L may be equal to 1, which may indicate that Din1 is sampled too close to the right end of the sampling window. At such point, controller 240 may direct the process to block 392. At block 392 controller 240 may increment Delay A and set UpFlag to be True. At this point, the process may be directed back to block 320 to start a new cycle. In various embodiments, Delay A may be incremented by a value of 1 or a value higher than 1 at block 392.

In other embodiments, ERR_H may have a value of 1 and ERR_L may have a value of 0, which may mean that the sampled values of Din1 and Din2 are different when Delay B is greater than Delay A, whereas the sampled values of Din1 and Din2 may be the same when Delay B is smaller than Delay A. In various embodiments, ERR_H may be equal to the value 1 and ERR_L may be equal to the value 0, which may indicate that Din1 is sampled too close to the left end of the sampling window. At such time, controller 240 may direct the process to block 394. At block 394, Delay A may be decremented and the DownFlag may be set to be True. In various embodiments, the process may then be directed back to block 320 to start a new cycle. In various embodiments, Delay A may be decremented by a value of 1 or a value higher than 1 at block 394.

In various embodiments, the input data signal Din may not change every clock cycle. Therefore, Din1 and Din2 may be sampled for K clock cycles and compared by comparator 230 (K is an integer greater than 1). If at any clock cycle the sampled values of Din1 and Din2 are different, controller 240 may direct the process to the corresponding block 392, 394 or 398, otherwise the process may be directed to block 396.

In other embodiments, controller 240 may further determine the value of DownFlag at block 390 before directing the process to block 392. If DownFlag is True which means that Delay A has been decremented, then controller 240 may direct the process to an end instead of incrementing Delay A. This may indicate that Din1 may be sampled approximately at the center of the sampling window already.

In another embodiment, controller 240 may determine at block 390 the value of UpFlag before directing the process to block 394. If the value of UpFlag is True, then controller 240 may direct the process to an end as well.

Figure 4:
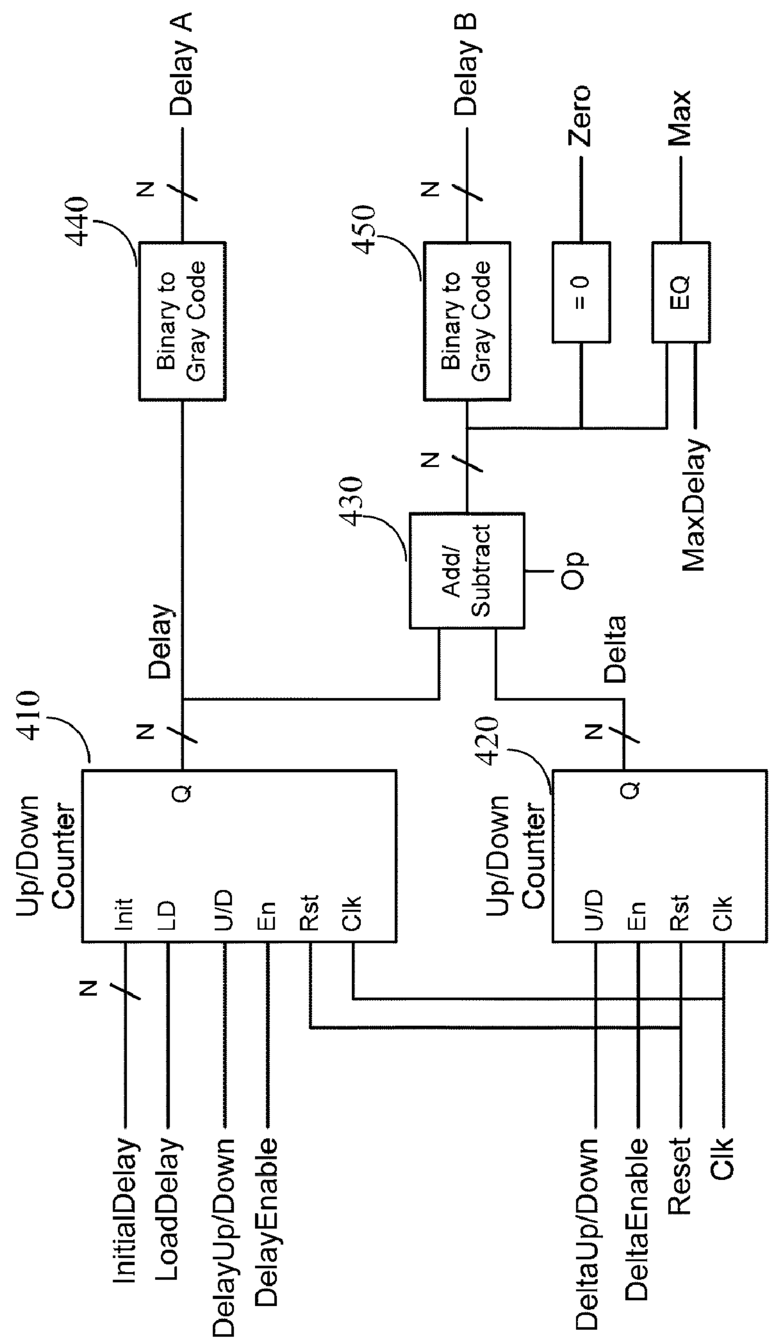
FIG. 4 illustrates a circuit of the controller in accordance with various embodiments of the present disclosure.

FIG. 4 illustrates a circuit of controller 240 in accordance with various embodiments of the present disclosure. In various embodiments, controller 240 may include two up/down counters 410 and 420. Up/down counter 410 may be configured to load a delay value as the initial value of Delay A. Up/down counter 410 may also be configured to receive a delay up/down control signal, and configured to count and generate an amount of delay which may be used as Delay A.

In various embodiments, up/down counter 420 may be configured to receive a reset control signal and generate an initial Delta value. In various embodiments, up/down counter 420 may be configured to receive a Delta up/down control signal and generate a Delta value. In various embodiments, the delay up/down and delta up/down signals may be generated by controller 240 based at least on the values of ERR_H and ERR_L.

In various embodiments, controller 240 may further comprise an Add/Subtract module 430 coupled to outputs of up/down counters 410 and 420, configured to add or subtract the value of Delta to or from the output of up/down counter 410, to generate different values of Delay B. In various embodiments, controller 240 may further include a Gray Code module 440 coupled to the output of up/down counter 410 to generate the value of Delay A. In other embodiments, controller 240 may further include another Gray Code module 450 coupled to the output of Add/Subtract module 430 to generate Delay B. In other embodiments, Gray Code modules 440 and 450 may be located outside circuit of controller 240. In various embodiments, controller 240 may further be configured to compare Delay B with a value 0 and a maximum delay value respectively before sending output to delay unit 212, and be configured to output control signals Zero or Max indicating whether Delay B is equal to 0 or the maximum delay value, based at least on a result of the comparison.

Figure 5:
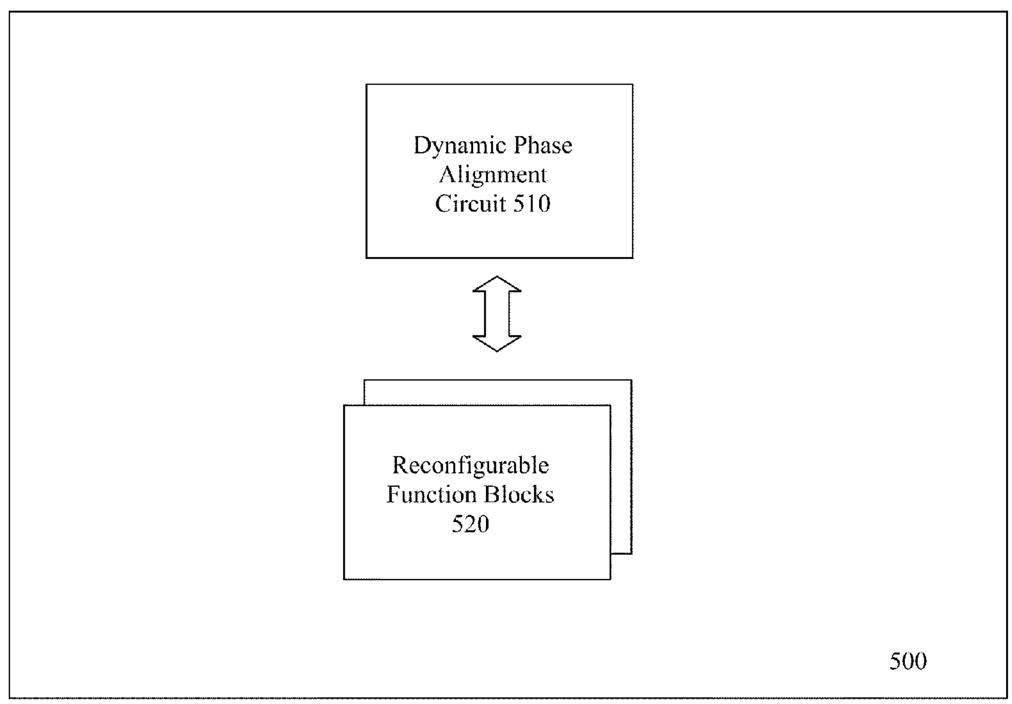
FIG. 5 illustrates a reconfigurable circuit in accordance with various embodiments of the present disclosure.

FIG. 5 illustrates a reconfigurable circuit 500 comprising a Dynamic Phase Alignment circuit 510 in accordance with various embodiments of the present disclosure. In various embodiments, the reconfigurable circuit 500 may further comprise a plurality of reconfigurable function blocks 520, which may be coupled with Dynamic Phase Alignment circuit 510. Reconfigurable function blocks 520 may include a number of reconfigurable logic cells, and/or a number of reconfigurable crossbars. In various embodiments, the reconfigurable logic cells and reconfigurable crossbars may be organized in a nested, hierarchical architecture as disclosed and described in U.S. Pat. No. 6,594,810, entitled "A RECONFIGURABLE INTEGRATED CIRCUIT WITH A SCALABLE ARCHITECTURE." In various embodiments, reconfigurable function blocks 520 may include re-mappable redundant reconfigurable logic cells as described and disclosed in U.S. Pat. No. 7,478,261, entitled "RECONFIGURABLE CIRCUIT WITH REDUNDANT RECONFIGURABLE CLUSTER(S)." In various embodiments, reconfigurable crossbars may include crossbars with reduced parasitic capacitance, as disclosed and described in U.S. Pat. No. 6,874,136, entitled "A CROSSBAR DEVICE WITH REDUCED PARASITIC CAPACITIVE LOADING AND USAGE OF CROSSBAR DEVICES IN RECONFIGURABLE CIRCUITS." In various embodiments, reconfigurable function blocks 520 may include a microcontroller configured to generate an expanded set of reconfigurable data a reduced input set of reconfigurable data, as disclosed and described in U.S. patent application Ser. No. 11/311,718, entitled "CONFIGURABLE CIRCUITS WITH MICROCONTROLLERS." Other embodiments of reconfigurable function blocks 520 may also be used.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A method for sampling an input data signal by an integrated circuit (IC), the method comprising:

receiving, by an input terminal of the IC, the input data signal;

routing the input data signal, via a delay chain of the IC, to a sampling circuit of the IC to sample the input data signal using a clock signal; and dynamically adjusting timing of the input data signal to enable the input data signal to be sampled by the sampling circuit within a sampling window of the input data signal without modifying the clock signal;

wherein a sampling window is a time period where the input data signal is stable for sampling.

2. The method of claim 1, further comprises:

determining the sampling window of the input data signal by a controller of the IC; and configuring the delay chain based at least in part on a relationship between the determined sampling window of the input data signal and the clock signal.

3. The method of claim 2, wherein sampling the input data signal is triggered at a reference edge of the clock signal.

4. The method of claim 2, wherein determining the sampling window comprises:

first sampling at a point in time, by the sampling circuit, the input data signal having a first amount of delay applied to the input data signal;

second sampling at the point in time, by the sampling circuit, the input data signal having a second amount of delay applied to the input data signal, wherein the second amount of delay equals to the first amount of delay plus a first delta value;

first comparing, by a comparator, sampled values of the input data signal from said first and second sampling; and recording a first result from said first comparing.

5. The method of claim 4, wherein determining the sampling window further comprises:

third sampling at the point in time, by the sampling circuit, the input data signal having a third amount of delay applied to the input data signal, wherein the third amount of delay equals to the first amount of delay minus a second delta value;

second comparing, by the comparator, sampled values of the input data signal from said first and third sampling; and recording a second result from said second comparing.

6. The method of claim 5, wherein determining the sampling window further comprises:

adjusting, by the controller, the first and the second delta values based at least in part on the first and second results from said first and second comparing.

7. The method of claim 6, wherein adjusting the first and the second delta values includes incrementing the first and the second delta values when the first and second results indicate that the sampled values from said second and third sampling are the same as the sampled value from said first sampling.

8. The method of claim 6, wherein adjusting the first amount of delay based at least in part on the first and second results includes:

incrementing the first amount of delay when the first and second results indicate that the sampled value from said second sampling is the same as the sampled value from said first sampling whereas the sampled value from said third sampling is different from the sampled value from the first sampling; and decrementing the first amount of delay when the first and second results indicate that the sampled value from said second sampling is different from the sampled value from said first sampling whereas the sampled value from said third sampling is the same as the sampled value from the first sampling.

9. An Integrated Circuit (IC), comprising:

an input terminal, configured to receive an input data signal;

a delay chain, coupled with the input terminal, configured to receive the input data signal, adjust timing of the received input data signal by a configurable amount of delay, and output the timing adjusted input data signal; and a sampling circuit, coupled with output of the delay chain, configured to sample the timing adjusted input data signal within a sampling window, using a clock signal, wherein said sampling within the sampling window is enabled in part by said adjusting of timing of the input data signal by the delay chain.

10. The IC of claim 9, further comprises:

a comparator, coupled with the sampling circuit;

a controller, coupled with the comparator and the delay chain;

wherein the delay chain includes:

a first delay element configured to apply a first configurable amount of delay to the input data signal;

a second delay element configured to apply a second configurable amount of delay to the input data signal;

wherein the comparator is configured to compare sampled values of the input data signal from the first and second delay elements at a point in time and generate a result based on said comparison.

11. The IC of claim 10, wherein the second configurable amount of delay is the first configurable amount of delay plus a first configurable delta value or the first configurable amount of delay minus a second configurable delta value.

12. The IC of claim 11, wherein the controller is configured to adjust the first and second configurable delta values, as well as the first and second configurable amount of delay based at least in part on results generated by the comparator.

13. A reconfigurable circuit comprising:

a plurality of reconfigurable function blocks; and a dynamic phase alignment circuit, including:

an input terminal, configured to receive an input data signal;

a delay chain, coupled with the input terminal, configured to receive the input data signal, adjust timing of the received input data signal by a configurable amount of delay, and output the timing adjusted input data signal; and a sampling circuit, coupled with output of the delay chain, configured to sample the timing adjusted input data signal within a sampling window, using a clock signal, wherein said sampling with the sampling window is enabled in part by said adjusting of timing of the input data signal by the delay chain.

14. The reconfigurable circuit of claim 13, wherein the dynamic phase alignment circuit further includes:

a comparator, coupled with the sampling circuit;

a controller, coupled with the comparator and the delay chain;

wherein the delay chain includes:

a first delay element configured to apply a first configurable amount of delay to the input data signal;

a second delay element configured to apply a second configurable amount of delay to the input data signal;

wherein the comparator is configured to compare sampled values of the input data signal from the first and second delay elements at a point in time and generate a result based on said comparison.

15. The reconfigurable circuit of claim 14, wherein the second configurable amount of delay is the first configurable amount of delay plus a first configurable delta value or the first configurable amount of delay minus a second configurable delta value.

16. The reconfigurable circuit of claim 15, wherein the controller is configured to adjust the first and second configurable delta values, as well as the first and second configurable amount of delay based at least in part on results generated by the comparator.

* * * * *